(12) United States Patent
Ehrler

(10) Patent No.: US 11,219,119 B2
(45) Date of Patent: Jan. 4, 2022

(54) METHOD FOR PROVIDING AN ELECTRICAL CONNECTION AND PRINTED CIRCUIT BOARD

(71) Applicant: Advantest Corporation, Tokyo (JP)

(72) Inventor: Sylvia Ehrler, Böblingen (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 16/844,306

(22) Filed: Apr. 9, 2020

(65) Prior Publication Data

US 2020/0288564 A1 Sep. 10, 2020

Related U.S. Application Data

(63) Continuation of application No. PCT/EP2019/055788, filed on Mar. 7, 2019.

(51) Int. Cl.
*H05K 1/02* (2006.01)
*H05K 1/11* (2006.01)
*H05K 1/18* (2006.01)

(52) U.S. Cl.
CPC ......... *H05K 1/0248* (2013.01); *H05K 1/0213* (2013.01); *H05K 1/0245* (2013.01); *H05K 1/111* (2013.01); *H05K 1/181* (2013.01); *H05K 1/02* (2013.01); *H05K 1/11* (2013.01); *H05K 1/117* (2013.01); *H05K 2201/0979* (2013.01); *H05K 2201/09209* (2013.01); *H05K 2201/09236* (2013.01); *H05K 2201/09281* (2013.01);
(Continued)

(58) Field of Classification Search
CPC ...... H05K 1/02; H05K 1/0213; H05K 1/0245; H05K 1/0248; H05K 1/11; H05K 1/111; H05K 1/117; H05K 1/181; H05K 2201/09209; H05K 2201/09236; H05K 2201/09281; H05K 2201/09736; H05K 2201/0979; H05K 2201/10356
See application file for complete search history.

(56) References Cited

U.S. PATENT DOCUMENTS 5,679,008 A * 10/1997 Takahashi ............ H01R 9/0515
 439/497
6,351,884 B1 * 3/2002 Damaschke ............. G01K 7/18
 29/842

(Continued)

FOREIGN PATENT DOCUMENTS

WO 2013/151839 A1 10/2013

*Primary Examiner* — Paresh H Paghadal

(57) ABSTRACT

Method for providing an electrical connection, comprising connecting a first cable to a first conducting structure on a printed circuit board, connecting a second cable to a second conducting structure on the printed circuit board, comparing a propagation delay of a first signal path comprising the first cable and the first conducting structure on the printed circuit board, and a propagation delay of a second signal path comprising the second cable and the second conducting structure on the printed circuit board; and removing conductive material of the first conducting structure and/or of the second conducting structure, in order to modify an electrical length of the first conducting structure and/or of the second conducting structure, to obtain a first conducting path and a second conducting path, in dependence on a result of the comparison, in order to reduce a difference of the propagation delays between the first signal path and the second signal path.

12 Claims, 11 Drawing Sheets

(52) U.S. Cl.
CPC .............. *H05K 2201/09736* (2013.01); *H05K 2201/10356* (2013.01)

(56) References Cited

U.S. PATENT DOCUMENTS

| | | | |
|---|---|---|---|
| 6,526,519 B1 | 2/2003 | Cuthbert | |
| 7,887,339 B2* | 2/2011 | Kumamoto | H01R 13/6589 |
| | | | 439/108 |
| 7,906,730 B2* | 3/2011 | Atkinson | H01R 13/6474 |
| | | | 174/78 |
| 9,373,915 B1* | 6/2016 | Schulz | H01R 13/6594 |
| 10,103,494 B2* | 10/2018 | Cornelius | H01R 13/6469 |
| 2003/0180011 A1* | 9/2003 | Aronson | H01R 13/6585 |
| | | | 385/92 |
| 2003/0221865 A1* | 12/2003 | Clark | H05K 1/0216 |
| | | | 174/261 |
| 2004/0090757 A1 | 5/2004 | Murata | |
| 2007/0111597 A1* | 5/2007 | Kondou | H05K 3/3485 |
| | | | 439/581 |
| 2007/0133933 A1* | 6/2007 | Yoon | G02B 6/4279 |
| | | | 385/129 |
| 2010/0265684 A1* | 10/2010 | Minegishi | H01L 23/49816 |
| | | | 361/783 |
| 2011/0203834 A1 | 8/2011 | Yoneya et al. | |
| 2017/0019145 A1* | 1/2017 | Mutnury | H01P 3/08 |
| 2018/0139839 A1* | 5/2018 | Staudt | H01L 23/49894 |
| 2019/0200449 A1* | 6/2019 | Toda | H05K 1/0245 |
| 2019/0341664 A1* | 11/2019 | Su | H05K 1/0225 |

* cited by examiner

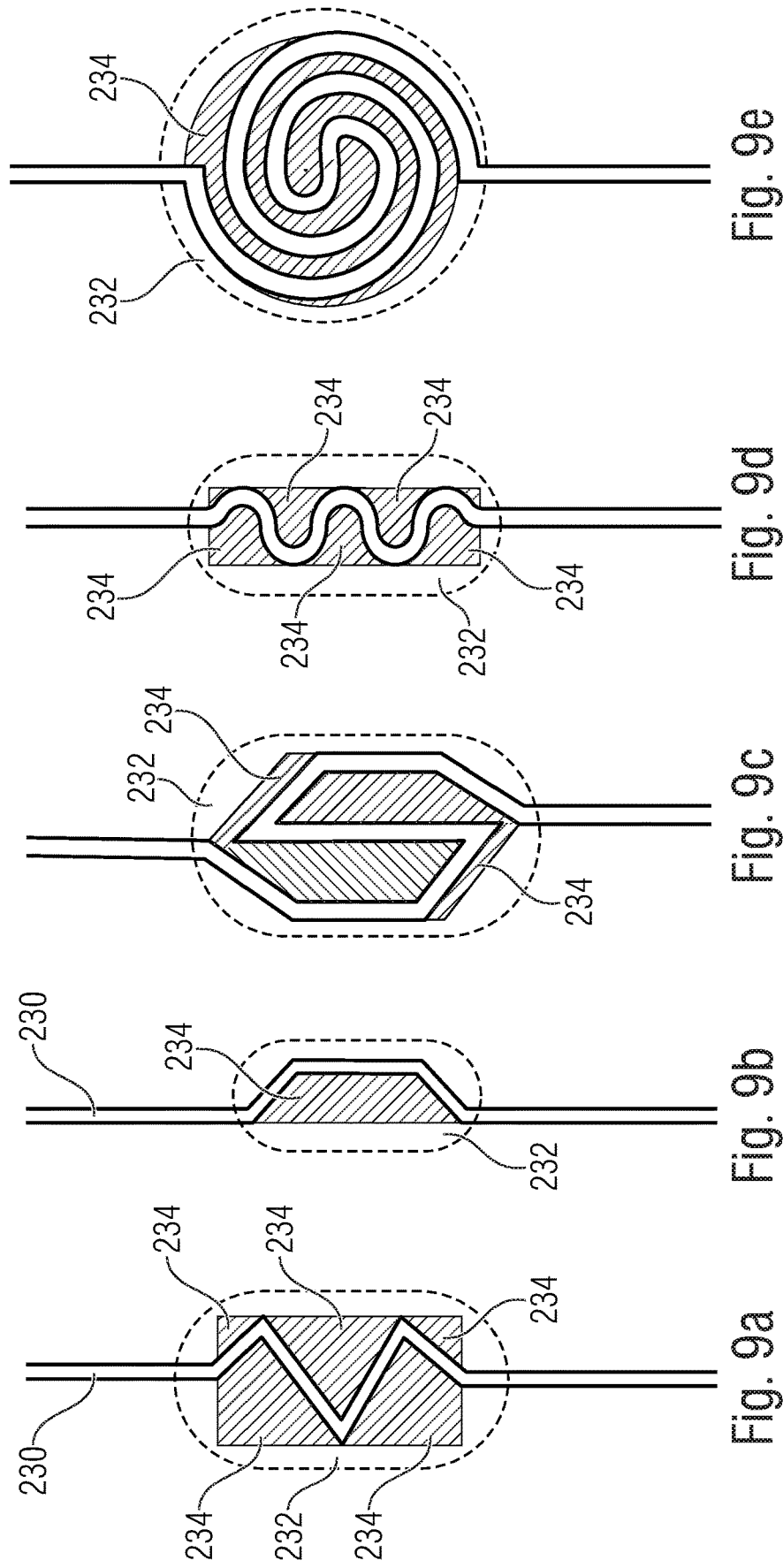

METHOD FOR PROVIDING AN ELECTRICAL CONNECTION AND PRINTED CIRCUIT BOARD

CROSS-REFERENCES TO RELATED APPLICATIONS

This application is a continuation of co-pending International Application No. PCT/EP2019/055788, filed Mar. 7, 2019, which is incorporated herein by reference in its entirety.

DESCRIPTION

Technical Field

Embodiments according to the invention related to a method for providing an electrical connection and a printed circuit board.

Background of the Invention

Today, cable assemblies with propagation time matching requirement better than +/−25 picoseconds are manufactured by measurement of each single wire, sorting and assembly related to the sorting result. This means large manual effort and therefore high cost.

The cables are, for example, sorted into groups and for a differential cable pair two cables from one group have to be sorted, for example, to a line pair at a printed circuit board.

In order to get a skew matching of better than +/−25 picoseconds for a line pair within a cable assembly, today it is necessary to perform the following steps:
  Cut the cable material to defined lengths
  Apply at least on one side a connector, which allows for a measurement by Time Domain Reflectometry (TDR)
  Measure the signal propagation delay of each of these prepared lines by TDR
  Sort the lines into groups with similar signal propagation delay (with a defined tolerance)
  For the cable assembly later it has to be ensured, that within a differential pair just cable material out of one group of lines with similar signal propagation delay will be used.

This method ensures certain maximum skew values for the differential pairs within a cable, but it requires a lot effort and it contains risk concerning mixing up lines of different signal propagation delays within one differential pair.

Therefore, it is desired to get a concept which makes a better compromise between reducing the signal propagation delay within a differential cable pair, efficiency and costs.

SUMMARY OF THE INVENTION

An embodiment according to this invention is related to a method for providing an electrical connection. The method comprises a step connecting a first cable to a first conducting structure on a printed circuit board and a step connecting a second cable to a second conducting structure on the printed circuit board. If the first cable and/or the second cable is a coaxial cable, the core of the cable (for example a CU core) can be connected to a first and/or second conducting structure on the printed circuit board. With the method, a propagation delay of a first signal path comprising the first cable and the first conducting structure on the printed circuit board, and a propagation delay of a second signal path comprising the second cable and the second conducting structure on the printed circuit board can be compared. The comparison can, for example, be understood as a calculation of a difference between the propagation delay of the first signal path and the propagation delay of the second signal path. The method can also comprise the step of removing conductive material from the first conducting structure and/or from the second conducting structure, in order to modify electrical lengths of the first conducting structure and/or of the second conducting structure, to obtain a first conducting path and a second conducting path, in dependence on a result of the comparison, in order to reduce a difference of the propagation delays between the first signal path and second signal path.

This embodiment is based on the idea that it is efficient to first connect the cables to a printed circuit board and afterwards comparing the propagation delays of the cables and to match the propagation delay of the cables by removing conductive material of the conducting structure connected to the respective cable in order to modify the electrical length of the conducting structure. Based on the comparison of the propagation delay of, for example, the first signal path and a propagation delay of the second signal path, it is possible to adjust the propagation delay of each single signal path comprising, for example, a cable and a conducting structure on a printed circuit board. The adjustment can be made on the printed circuit board, therefore no measurement or sorting is, for example, necessary before the soldering process.

It should be noted that the invented method for providing an electrical connection is able to reduce the signal propagation delay differences within a differential cable pair (which, for example, comprises a first cable and a second cable) by removing conductive material of a conducting structure connected to the respective cable in order to modify the electrical lengths. If, for example, the first signal path comprising the first cable and the first conducting structure on the printed circuit board has a longer propagation delay than the propagation delay of a second signal path comprising the second cable and the second conducting structure on the printed circuit board, part of the conductive material of the second conducting structure is removed such that the electrical length of the second conducting structure is increased to the electrical length of the first conducting structure, to obtain nearly the same propagation delay of the first signal path and the second signal path. With an elongation of the electrical length of the conducting structure, the propagation delay of a signal path increases. Thus, the propagation delay of, for example, a first signal path and a second signal path can be matched and the difference between the respective propagation delays can be reduced.

Furthermore, the method enhances the efficiency by the possibility of performing the adjustment on the printed circuit board, whereby cost can be reduced.

In an embodiment of the method, the propagation delays of the first and second signal paths can be determined by time domain reflectometry measurement. For the time domain reflectometry (TDR) measurement for example the first and the second signal paths can be connected to a TDR measurement system, with which all the signal paths can be measured for their signal propagation delay subsequently. The propagation delay of the first signal path and the second signal path determined by time domain reflectometry measurement can be compared. Thus, with the TDR measurement it is possible to get accurate propagation delays of the signal paths. Thus, the propagation delay of the signal path can be evaluated very fast, accurate and efficiently whereby it is possible to increase the accuracy of calculating the difference of the propagation delays between the first signal path and the second signal path and therefore optimizing the removal of conductive material of the first conducting structure and/or the second conducting structure. Thus, it is possible to match the propagation delay of the first signal path and the second signal path, for example, with high precision and only a very small or none difference in the propagation delay.

In an embodiment of the method, the propagation delay difference can be determined from the propagation delay of the first signal path and the second signal path. This can, for example, be done by the method step comparing a propagation delay of a first signal path and a propagation delay of a second signal path. Based on the propagation delay difference, conductive material of the first conducting structure and/or the second conducting structure can be removed, so that the first conducting path and the second conducting path can be formed (the conducting path can, for example, be rippled, straight, acute-angled or in the form of a meander), and so that the propagation delay difference is at least partially compensated. Thus, for example, if the propagation delay of one signal path is longer than the propagation delay of the corresponding signal path, the signal path with the shorter propagation delay can be formed such that the conducting path increases and receives the electrical length of the corresponding signal path. Therefore, for example, a signal path with a long propagation delay can comprise a straight conducting path and a signal path with a short propagation delay can comprise a rippled conducting path. With this implementation, the propagation delay difference between, for example, the first signal path and the signal path can be at least partially compensated.

In an embodiment of the method, the method comprises the step shaping the first conducting structure on the printed circuit board by removal of conductive material such that the first conducting path is obtained therefrom having a first electrical length, and/or shaping the second conducting structure on the printed circuit board by removal of conductive material such that the second conducting path is obtained therefrom having a second electrical length, wherein the first electrical length is shorter than the second electrical length. With the shaping step of the method, the conducting structures can be formed in many different ways. The conducting structure can, for example, be shaped as a straight line, a rippled line, a sharp-angle formed line, a line formed like a meander, etc. This enumeration of different shaping forms of the conducting structure has to be seen as exemplarily and non-exhaustive. For example, before the shaping, the first signal path comprising the first cable and the first conducting structure on the printed circuit board can have a longer propagation delay than the propagation delay of the second signal path comprising the second cable and the second conducting structure on the printed circuit board. In this embodiment, the first electrical length (of the first conducting path), which is achieved by the shaping, can be shorter than the second electrical length (of the second conducting path), which is achieved by the shaping, what can enable, for example, a partial compensation of an original propagation delay difference between the propagation delay of the first signal path and the propagation delay of the second signal path. In other words, before the shaping, a first (overall) signal path (including the first cable) is longer than the second (overall) signal path (including the second cable). Accordingly, the shaping is performed in such a manner that a first electrical length (of the first conductive path on the pcb), which is obtained by a removal of conductive material, is shorter than the second electrical length (of the second conductive path on the pcb). Accordingly, different lengths of the cables are (at least partially) compensated. Because of the shorter first electrical length compared to the second electrical length, the signal propagating through the first signal path can propagate through the first conducting path faster that the signal propagating through the second signal path propagates through the second conductive path.

Because of the shorter first electrical length compared to the second electrical length, the signal propagation through the first signal path is faster than in the second signal path. Thus, for example, if the signal propagating through the first signal path needs a longer propagation time through the first cable than the signal propagating through the second cable of the second signal path, the different electrical lengths of the first electrical length and the second electrical length can ensure, that the signals propagating through the first signal path and through the second signal path can complete the respective signal path at nearly the same time (the original propagation delay difference between the first signal path and the second signal path, which is caused by different cable lengths, can be at least partially compensated by the different electrical lengths of the conducting paths).

In an embodiment, the method comprises the step removing conductive material of the first conducting structure such that the first conducting path is obtained forming a straight line in a defined range of the first conducting path and a step removing conductive material of the second conducting structure such that the second conducting path is obtained forming a non-straight line in a corresponding defined range of the second conducting path. The first conducing structure and/or the second conducting structure can comprise a conducting path and two contact paths. Thus, the conductive material of the first conducting structure can be removed such that the first conducting path is obtained forming a straight line between opposing contact pads and the conductive material of the second conducting structure can be removed such that the second conducting path is obtained forming a non-straight line between opposing contact pads. With this embodiment, the first conducting path with a straight line has a shorter length than the second conducting path with a non-straight line.

Thus, a signal can propagate through the first conducting path (e.g. a first structured region on the printed circuit board) faster than through the second conducting path (e.g. a second structured region on the printed circuit board), which can enable an at least partial compensation of an original propagation delay difference between the signal propagating through the first signal path (including the first cable) and the signal propagating through a second signal path (including the second cable).

An embodiment according to this invention is a printed circuit board, comprising a first contact pad configured to contact a first cable, a second contact pad configured to contact a second cable, a third contact pad configured to contact a device, a fourth contact pad configured to contact a device, a first conducting path connecting the first contact pad and the third contact pad, and a second conducting path connecting the second contact pad and the fourth contact pad. Conductive material of a conducting structure connecting the second contact pad and the fourth contact pad is removed subsequent to a definition of the conducting structure to thereby define the second conducting path so that a propagation delay difference of signal paths comprising the first conducting path with the first cable and the second conducting path with the second cable is at least partially compensated. The first conducting path can have a defined length between the first contact pad and the third contact pad. The length of the second conducting path can be modified by, for example, an ablation of conductive material of the conducting structure connecting the second contact pad and the fourth contact pad. The physical length of the second conducting path can thus be formed such that it is either shorter or longer than the length of the first conducting path. Before the conductive material of the conducting structure of the second conducting path is removed, the second conducting path can, for example, have the same physical length as the first conducting path. If a signal propagating through the first conducting path has a shorter propagation time than the signal propagating through the second conducting path, the first conducting path can comprise a conducting structure connecting the first contact pad and the third contact pad which lengths is lengthened by a removal of conductive material. In the other case, if the signal propagating through the first signal path has a longer propagation time than the signal propagating through the second signal path, the conducting structure connecting the second contact pad and the fourth contact pad is, for example, lengthened by a removal of conductive material. Thus, the lengths of the second conducting path can be modified by a removal of conductive material such that between the signal propagating through the first signal path (e.g. first conducting path and first cable) and the signal propagating through the second signal path (e.g. second conducting path and second cable) has nearly no propagation delay difference. Thereby, the propagation delay difference of signal paths can at least partially be compensated. Thus, the printed circuit board is able to reduce a propagation delay difference between, for example, a differential cable pair (for example, the first cable and the second cable) with high efficiency and a reduction of costs.

In an embodiment, the printed circuit board can be connected to a first cable and a second cable. The shape of the second conducting path on the printed circuit board can be electrically elongated by the removal of conductive material (e.g. from the second conducting structure) compared to the first conducting path on the printed circuit board in order to at least partially compensate a propagation delay difference between the first cable and the second cable. Thus the second signal path can, for example, comprise the second conducting path with a longer length than the first conducting path and a second cable with a shorter propagation delay than the first cable, whereby the propagation delay difference between the first signal path and the second signal path can at least partially be compensated.

In an embodiment of the printed circuit board, the first conducing path is shaped so that a width of the first conducting path is constant between the first contact pad and the third contact pad by subsequent removal of conductive material of a conducting structure. Also, the second conducting path can be shaped so that a width of the second conducting path is constant between the second contact pad and the fourth contact pad by subsequent removal of conductive material of a conducting structure. Particularly, the width of the second conducting path can, for example, be the same width as the width of the first conducting path. If the width of the conducting path, for example, changes between two contact pads, the inductance and the capacitance of the conducting path on the printed circuit board can change and influence the signal propagating through the conducting path (e.g. signal reflections, changes of signal amplitude, etc.). Thus, it is necessary that the width of the conducting path stays constant between the contact pads, and only the lengths of the conducting path should be changed. Problems can especially occur when the first conducting path of a differential cable pair (for example, a first cable with a first conducting path and a second cable with a second conducting path) comprises a different width than a second conducting path. In such a case, for example, the first signal propagating through the first contact path is influenced differently from a second signal propagating through the second conducting path.

In an embodiment of the printed circuit board, the first conducting path and the second conducting path are arranged in parallel to each other, except for an area in which the second path comprises an elongation created by the removal of conductive material of a conducting structure. This means, for example, that the second conducting path is in the area, for example, rippled, in the form of a meander, sharp-angled, etc. to comprise, for example, a longer path than the first conducting path in this area. In the regions where the second conducting path and the first conducting path are arranged in parallel to each other, the first conducting path and a second conducting path can comprise the same length. Because of the parallel regions and the area with the elongation of the second conducting path, the propagation of a signal through the second conducting path can be prolonged with respect to the propagation time of a signal propagating through the first conducting path. Thus, a propagation delay difference between a first cable connected to the first conducting path and a second cable connected to a second conducting path can at least partially be compensated by the different length of the second conducting path and a first conducting path.

In an embodiment of the printed circuit board, a first design reference line along which the first contact pad and the second pad are aligned, is parallel to a second design reference line along which the third contact pad and the fourth contact pad are aligned. Thus, it is possible to use only a small room (respectively area or space) on a printed circuit board and a dimension (respectively a size or a space) for the first conducting path between the first contact pad and the third contact pad has, for example, the same length as a dimension (respectively a size or a space) for the second conducting path between the second contact path and the fourth contact pad. Thus, the printed circuit board according to the invention can be realized with minimized cost and a high efficiency.

In an embodiment, the printed circuit board can comprise a connector connected to the third contact pad and the fourth contact pad, wherein the connector is configured to connect to a board. This is a structure which can be applied for pogo cable assemblies in the pogo block, or for board cables at the board connector side.

In an embodiment of the printed circuit board, one end of the first cable which is not connected to the printed circuit board is connected (i.e. attached) to a connector (i.e. plug), and wherein one end of the second cable which is not connected to the printed circuit board is connected to a connector. The connector at the first cable can be the same connector as the one at the second cable or a different one. The connector enables to connect the first cable and the second cable, for example, to a device. Thus the printed circuit board can easily be integrated in a bigger system, Network or device, whereby it is very efficient.

In an embodiment of the printed circuit board, a first area of the printed circuit board which is formed by removal of conductive material of a conductive structure by laser ablation, milling, routing or etching is located closer to a cable-sided edge of the printed circuit board than a second area of the printed circuit board which is formed by removal of conductive material of a conductive structure by laser ablation, milling, routing or etching. The first area is, for example, adjacent to the first conducting path and the second area is, for example, adjacent to the second conducting path. This means, for example, that the first or second conducting path leading from a contact pad (for example, the first contact pad or the second contact pad) to another contact pad (for example, the third or fourth contact pad) can be located adjacent to the first area and/or the second area. For example, the conductive paths (e.g. from the first pad to the third pad, or from the second pad to the fourth pad) can deviate in the first or second (adjustment) area from a straight line between the two corresponding contact pads, such that the (respective) contacting path is not straight anymore. In other word, the conductive path breaks out of the straight line at a beginning of the first or second area and goes at least through some extent in a direction perpendicular to the straight line (for example, completely perpendicular, diagonal or with an angle between 0° and 90°) and then the conducting path changes direction again and can go parallel to the straight line and at the end of the first or second area, the conducting path is guided back to the virtual straight line and leads on that virtual straight line to the corresponding contact pad. In other words, for example, the first conducting path between the first contact pad and the third contact pad goes at first straight from the first contact pad in the direction of the third contact pad and then goes a bit to the right or to the left and continues there straight on for some lengths and then goes back (respectively left or right) and continues then straight to the third contact pad. For example, the first conducting path between the first and the third contact pad will be equipped with a rectangular or trapezoidal area of conductive material, sidelong or centered to the trace, and connected to the conductive path. The forming (or shaping) of this area allows for the electrical elongation of this path.

In an embodiment of the printed circuit board, the first conductive path includes a widening which is in a staggered layout position to a similar widening of the second conducting path, allowing to be formed by removal of conductive material by laser ablation, milling, routing or etching. This can, for example, mean that conductive material of the widening of the first conducting path and the similar widening of the second conductive path can be removed by laser ablation, milling, routing or etching in such a way, that in the widening a shaped conducting path (for example a rippled path, a meander formed path, etc.) is generated.

In an embodiment of the printed circuit board, the first area or the second area are of trapezoidal or hexagonal shape. This enables, for example, a realization of the printed circuit board with minimized cost and a high efficiency.

In an embodiment of the printed circuit board, one of the conducting paths comprises a trapezoidal or hexagonal portion so that one conducting path may be electrically elongated compared to the corresponding conducting path. This means, for example, that the trapezoidal or hexagonal portion of the conducting path can elongate the electrical length of the conducting path compared to the lengths of the corresponding conducting path. For example, the first conducting path can have a trapezoidal or hexagonal portion and the second conducting path can have no trapezoidal or hexagonal portion. In this case, the first conducting path comprises, for example, a longer electrical length than the second conducting path. Thus, the signal propagation delay of the first conducting path is prolonged with respect to the signal propagation delay of the second conducting path. Thus, the propagation delay difference between the first signal an a second signal is reduced, if originally, before the removal (shaping) of material off the conductive structure, the second signal path has a longer propagation delay than the first signal path.

In an embodiment, a printed circuit board can comprise a first contact pad configured to contact a first cable, a second contact pad configured to contact a second cable, a third contact pad configured to contact a device, a fourth contact pad configured to contact a device, a first conductive structure configured to form a first conducting path connecting the first contact pad and the third contact pad, a second conductive structure configured to form a second conducting path connecting the second contact pad and the fourth contact pad. The first conductive structure and the second conductive structure can be configured to allow a modification of the propagation delay by definition of shapes of the first conducting path and the second conducting path. This means, for example, that the first conductive structure and/or the second conductive structure are at least at some parts widened, where conductive material can be removed in order to realize the first conducting path or the second conducting path with, for example, a special shape, which can define a modification of the propagation delay. With a different shaping of the first conducting path with regard to the second conducting path, the first conducting path can, for example, have a different length than the second conducting path. Thus, the first conducting path can comprise a different propagation delay than the second conducting path. With this modification, a propagation delay difference between the first cable and the second cable can be reduced. With this embodiment, the modification of the propagation delay can be realized directly on the printed circuit board. Therefore, the circuit board is very efficient in reducing a propagation delay difference of a differential cable pair and able to reduce costs.

In an embodiment of the printed circuit board, a first line along which the first contact pad and the second contact pad are aligned, can be parallel to a second line along which the third contact pad and the fourth contact pad are aligned. This means, for example, that at the beginning, before material is removed from at least one of the two conducting paths between the contact pads, the two conducting paths have the same electrical length, wherein a first conducting path is aligned between the first contact pad and the third contact pad parallel to a second conducting path aligned between the second contact pad and the fourth contact pad. Thus, only a small space is needed on the printed circuit board for the conducting structures, whereby cost can be reduced and the production of the printed circuit boards can become more efficient.

In an embodiment of the printed circuit board, the first conducting structure contains a conductive adjustment area and the second conducting structure contains a similar conductive adjustment area. The first or the second conductive adjustment area can be intended to allow for a removal of conductive material by laser ablation, milling, or etching, so that a shape and an electrical length of the first conductive path or the second conductive path may be defined by the removal. The conductive adjustment area of the first conducting structure can be indicated as a first area or a first conductive area in the following and the similar conductive adjustment area of the second conducting structure can be indicated as a second area or a second conductive area in the following. It is possible, that the complete conducting structure defines the conductive adjustment area.

In an embodiment of the printed circuit board, the first area and/or the second area are of trapezoidal or hexagonal shape. The first area and/or the second area can, for example, be the complete conducting structure.

The method as described above is based on the same considerations as the above-described printed circuit board. The method can, by the way, be completed with all features and functionalities, which are also described with regard to the printed circuit board.

BRIEF DESCRIPTION OF THE DRAWINGS

The drawings are not necessarily to scale, emphasis instead generally being placed upon illustrating the principles of the invention. In the following description, various embodiments of the invention are described with reference to the following drawings, in which:

FIG. 9a shows a sharp-angle shaped conducting path for a printed circuit board according to an embodiment of the present invention;

FIG. 9b shows a trapezoidal shaped conducting path for a printed circuit board according to an embodiment of the present invention;

FIG. 9c shows a hexagonal shaped conducting path for a printed circuit board according to an embodiment of the present invention;

FIG. 9d shows a rippled/meander shaped conducting path for a printed circuit board according to an embodiment of the present invention; and FIG. 9e shows a circular/meander shaped conducting path for a printed circuit board according to an embodiment of the present invention.

DETAILED DESCRIPTION OF THE EMBODIMENTS

Figure 1:
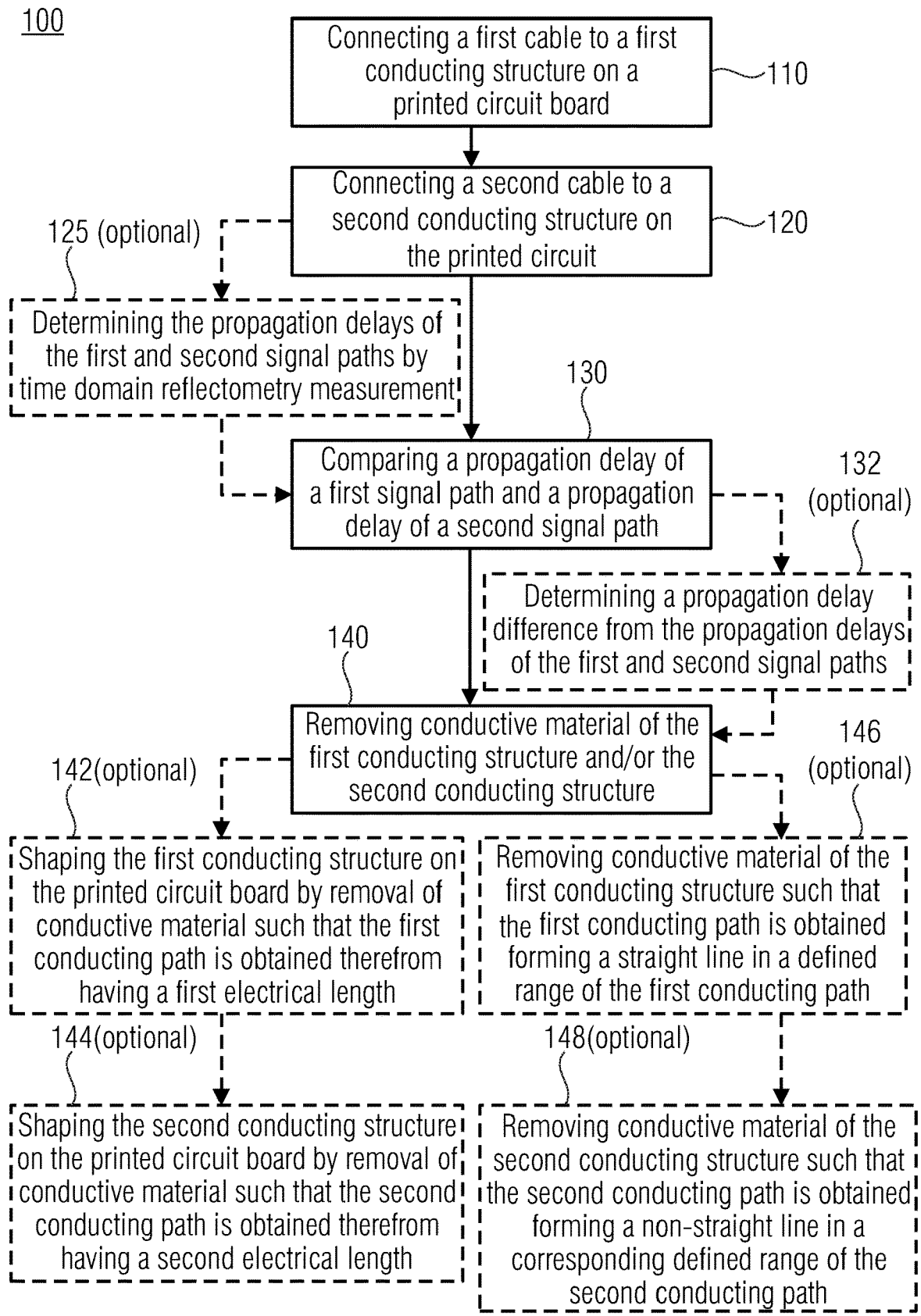
FIG. 1 shows a block diagram of a method for providing an electrical connection according to an embodiment of the present invention.

Equal or equivalent elements or elements with equal or equivalent functionality are denoted in the following description by equal or equivalent reference numerals even if occurring in different figures.

In the following description, a plurality of details is set forth to provide a more throughout explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described herein after may be combined with each other, unless specifically noted otherwise.

FIG. 1 shows a block diagram of a method 100 for providing an electrical connection. The method 100 comprises the step connecting 110 a first cable to a first conducting structure on a printed circuit board, connecting 120 a second cable to a second conducting structure on the printed circuit board and comparing 130 a propagation delay of a first signal path comprising the first cable and the first conducting structure on the printed circuit board, and a propagation delay of a second signal path comprising the second cable and the second conducting structure on the printed circuit board. Furthermore, the method 100 can comprise the step removing 140 conductive material of the first conducting structure and/or of the second conducting structure, in order to modify an electrical length of the first conducting structure and/or of the second conducting structure, to obtain a first conducting path and a second conducting path, in dependence on a result of the comparison, in order to reduce a difference of the propagation delays between the first signal path and the second signal path.

Optionally, the propagation delays of the first and second signal paths can be determined 125 by time domain reflectometry measurement before comparing the propagation delay of the first signal path and the propagation delay of the second signal path.

Optionally, a propagation delay difference from the propagation delays of the first and second signal paths can be determined 132, wherein based on the propagation delay difference, conductive material of the first conducting structure and/or second conducting structure can be removed 140, so that the first conducting path and the second conducting path is formed, and so that the propagation delay difference is at least partially compensated. The determining 132 of the propagation delay difference from the propagation delays of the first and second signal paths does not necessarily have to be an own step. The step comparing 130 of a propagation delay of a first signal path and a propagation delay of a second signal path can already be the step determining 132 of a propagation delay difference from the propagation delays of the first and second signal paths. This means, for example, that the determining 132 of a propagation delay difference from the propagation delays of the first and second signal paths can be an example of the step comparing 130 a propagation delay of a first signal path and a propagation delay of a second signal path.

Optionally, the method 100 can comprise a shaping 142 of the first conducting structure on the printed circuit board by removal of conductive material such that the first conducting path is obtained therefrom having a first electrical length and a shaping 144 of the second conducting structure on the printed circuit board by removal of conductive material such that the second conducting path is obtained therefrom having a second electrical length, wherein the first electrical length is, for example, shorter than the second electrical length. The shaping steps 142 and 144 don't have to be steps on their own. They can, for example, be details of the step removing 140 of conductive material of the first conducting structure and/or the second conducting structure. Thus, the shaping steps 142 and 144 can define how the removing 140 of conductive material of the first conducting structure and/or of the second conducting structure can be realized.

Optionally, the method 100 can comprise the step removing 146 conductive material of the first conducting structure such that the first conducting path obtained forming a straight line in a defined range of the first conducting path and a removing 148 of conductive material of the second conducting structure such that the second conducting path is obtained forming a non-straight line in a corresponding defined range of the second conducing path. The removing steps 146 and 148 can be examples of the removing 140 of conductive material of the first conducting structure and/or of the second conducting structure. Thus, the removing steps 146 and 148 don't necessarily have to be steps of their own.

In other words, the method 100 can adjust skew of differential pairs for cable assemblies. Wires, for example, the first cable and the second cable, can be soldered to the solder pads (for example, contact pads connected with a conducting structure) of the PCB without upfront measurement of signal propagation time in the wires. Afterwards, the signal propagation times of the single lines can be measured and stored. The design of the traces, for example, the conducting paths, connecting the solder pads and related contact pads can include the possibility of a subsequent adjustment of the trace lengths by removing parts of these structures, so that propagation times within differential pairs may be matched. The partial removing of the, for example, metallic structure of the trace may be done by etching methods, milling/routing, laser ablation or any other method which can eliminate the metallic trace material.

Avoiding upfront measurement of single wires and sorting them means lower manual effort and therefore lower overall costs of the final cable assembly. In addition to that, it could be avoided that wires are mixed up before soldering, which could improve yield and/or quality.

In other words, in an embodiment of the method 100, cable lines are cut to a defined length and on one side a final connector can be applied. The other side can be soldered to a PCB as usually applied for pogo cable assemblies in the pogo block, or for board cables at the board connector side. There is no measurement or sorting necessary before the soldering process. The sub-assembly is, for example, connected to a TDR (time domain reflectometry measurement) and all the lines are, for example, measured for their signal propagation delay subsequently. Based on the measured values, it is possible to adjust the propagation delay of each single line. The adjustment can be made on the PCB, which can be part of the cable sub-assembly.

In other words, the method 100 can be used to adjust the electrical path lengths for cables.

Figure 2:
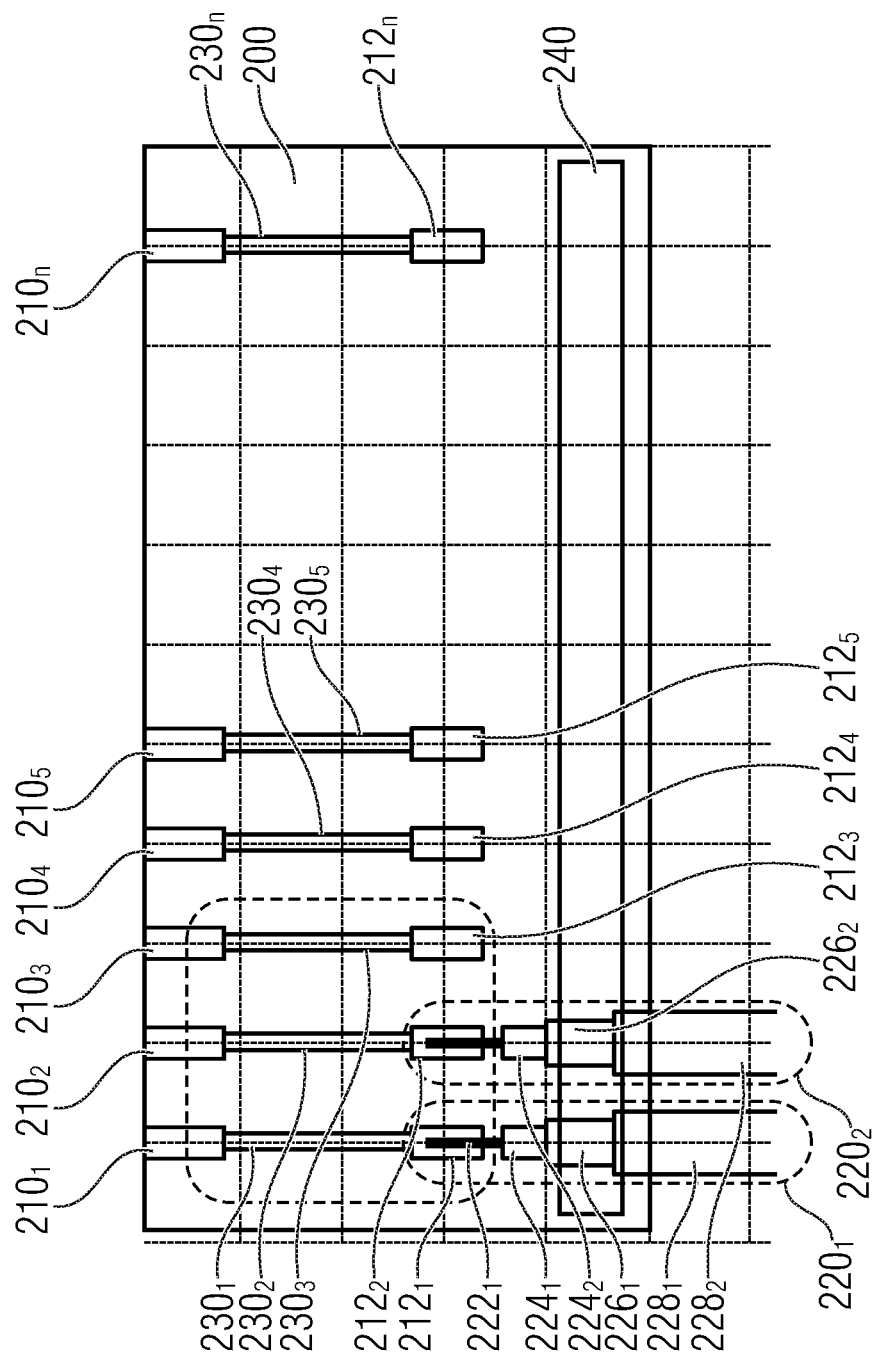
FIG. 2 shows a schematic view of a printed circuit board according to an embodiment of the present invention.

FIG. 2 shows a schematic view of a printed circuit board 200 (PCB) comprising contact pads $210_1$ to $210_n$ for, for example, a mating connector or mating plug and contact pads $212_1$ to $212_n$, respectively soldering pads, for a cable core (e.g. inner conductor) $222_1$, $222_2$ (signal), a conducting structure (e.g. trace) $230_1$ to $230_n$ connecting the contact pads $212_1$ to $212_n$ with the contact pads $210_1$ to $210_n$ and an area for ground 240, wherein n can be a natural number.

A first cable $220_1$ and a second cable $220_2$ can be connected to the PCB by, for example, soldering of the cable core $222_1$ and $222_2$ to the contact pads $212_1$ and $212_2$. The first cable $220_1$ and the second cable $220_2$ can comprise a cable core $222_1$, $222_2$, an inner dielectric insulator $224_1$, $224_2$, a conductive shield $226_1$, $226_2$ and a jacket $228_1$, $228_2$. The first cable $220_1$ and the second cable $220_2$ can, for example, represent a differential cable pair.

The invention is based on the idea that wires, for example, the first cable $220_1$ and the second cable $220_2$, could be just cut with a defined length tolerance and then soldered without upfront measurement and unsorted to the PCB. Then each line can be measured concerning the electrical propagation time from the contact pads $210_1$ to $210_n$ in the front of the PCB to the end of the cable $220_1$, $220_2$, which is not connected to the PCB. In the conducting structure $230_1$ to $230_n$ between the contact pads $212_1$ to $212_n$ and the contact pads $210_1$ to $210_n$, it is possible to subsequently adjust the propagation time of each line (for example, from the contact pads $210_1$ to $210_n$ to the end of the cable $220_1$, $220_2$). The adjustment of the propagation time of each line/connection could be done, for example, after measurement of the pre-assembly (cables/wires plus PCB). By that, also the tolerance on the soldering position of the wire to the PCB 200 would be corrected. Thus, one can save the effort for previous measurements, sorting and correctly sorted soldering. In other words, the invention would avoid the upfront measurement and sorting of the wires.

Figure 3:
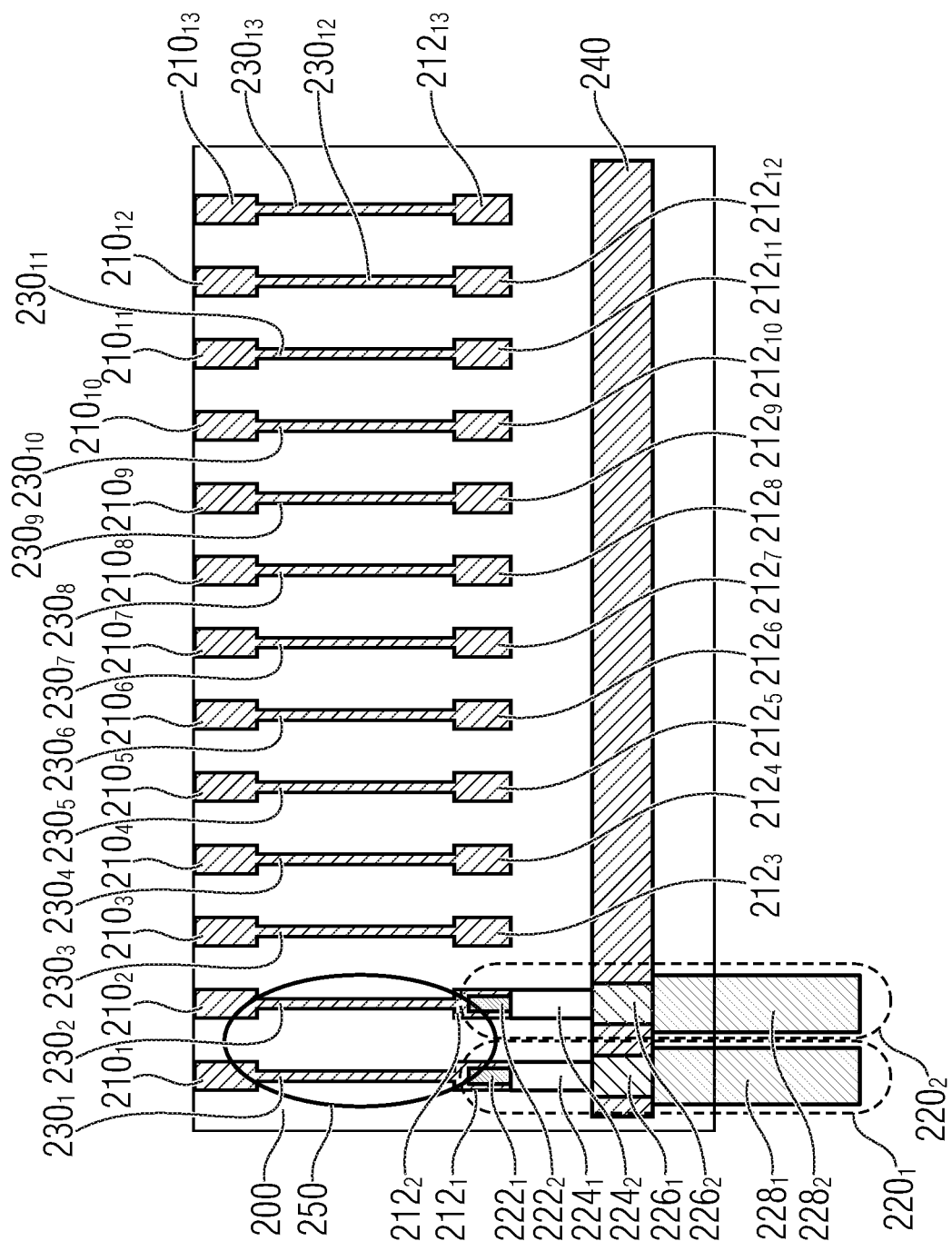
FIG. 3 shows a schematic view of a printed circuit board with 13 conducting paths according to an embodiment of the present invention.

FIG. 3 shows a schematic view of a printed circuit board 200 comprising contact pads $210_1$ to $210_{13}$ to contact, for example, pogo or board connectors, contact pads $212_1$ to $212_{13}$, for cable lines (signals), conducing paths $230_1$ to $230_{13}$, respectively traces, and a pad 240 to solder ground GND (cable shieldings). Two cables, a first cable $220_1$ and a second cable $220_2$, can be connected to the PCB 200 by, for example, soldering a cable core $222_1$, $222_2$ to the contact pad $212_1$, $212_2$ and by connecting a cable shielding $226_1$, $226_2$ to the ground pad 240. The first cable $220_1$ and the second cable $220_2$ can also comprise an inner dielectric insulator $224_1$, $224_2$ and a jacket $228_1$, $228_2$. Thus, the first cable $220_1$ and/or the second cable $220_2$ can be coaxial cables.

The cable core $222_1$, $222_2$ can be a copper core and the cable shielding $226_1$, $226_2$ can be a copper shielding.

The propagation delay adjustment according to this invention can take place on the PCB 200 at the conducting path $230_1$ to $230_{13}$. For example, for the first cable $220_1$ and the second cable $220_2$, the signal propagation delay adjustment can take place in the area 250. The adjustment of the signal propagation delay of each line can, for example, be realized by forming the conducting structures $230_1$ to $230_{13}$ and thus giving the individual conducting paths $230_1$ to $230_{13}$ individual lengths.

Also, only a first cable $220_1$ and a second cable $220_2$ is connected to a PCB 200 in FIG. 3 and FIG. 2, it is possible to connect on each contact pad (contact pad $212_1$ to $212_n$ in FIG. 2 and contact pads $212_1$ to $212_{13}$ in FIG. 3) on the PCB 200 a cable. According to the embodiment of FIG. 3 up to 13 cables all together can be connected to the PCB 200.

Figure 4:
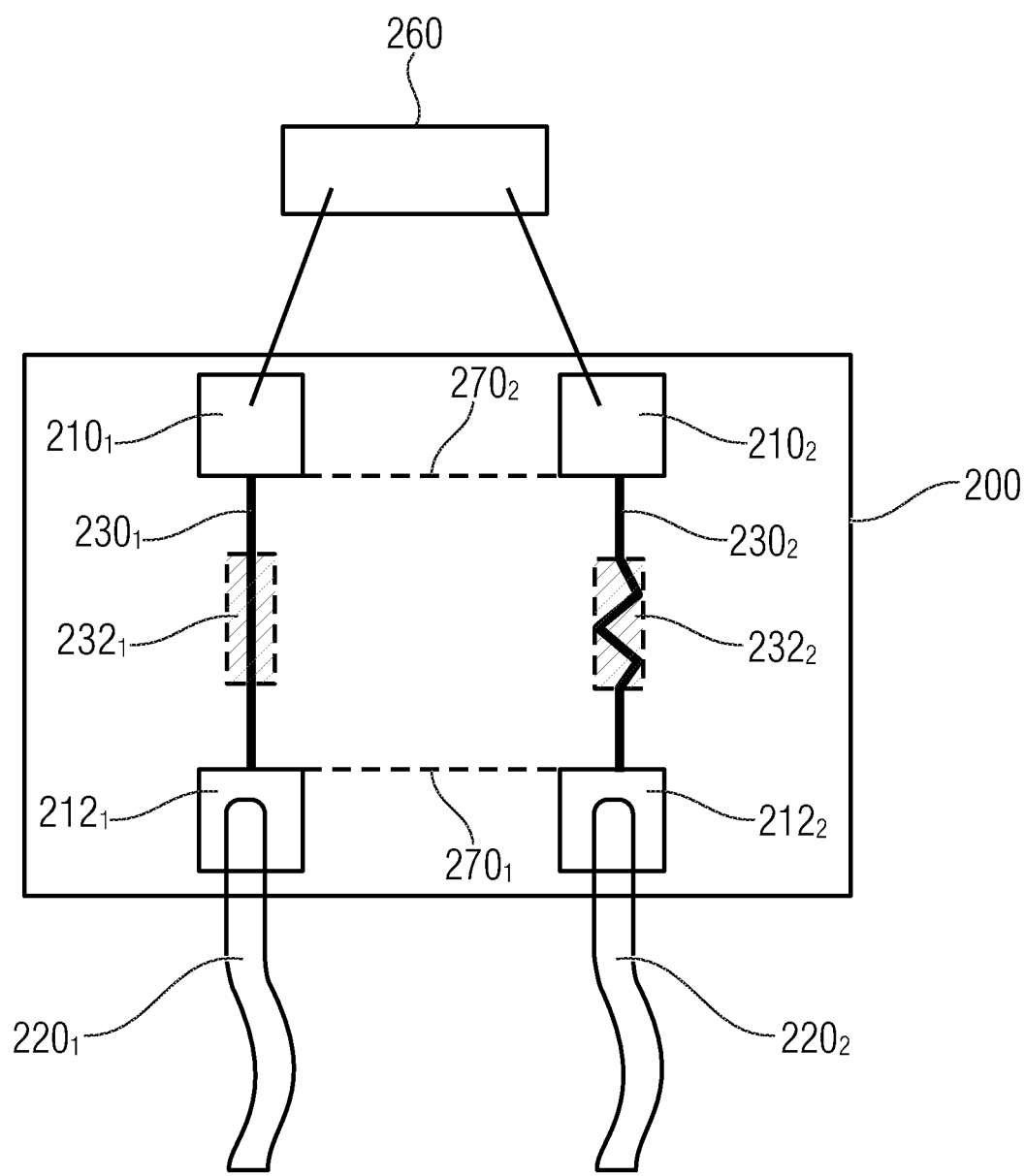
FIG. 4 shows a schematic view of a printed circuit board with a first conducting path and a second conducting path after processing according to an embodiment of the present invention.

FIG. 4 shows a schematic view of a printed circuit board 200 comprising a first contact pad $212_1$, configured to contact a first cable $220_1$, a second contact pad $212_2$, configured to contact a second cable $220_2$, a third contact pad $210_1$, configured to contact a device 260, a fourth contact pad $210_2$, configured to contact a device 260, a first conducting path $230_1$, connecting the first contact pad $212_1$ with the third contact pad $210_1$, and a second conducting path $230_2$, connecting the second contact pad $212_2$ with the fourth contact pad $210_2$. Also, in FIG. 4, it is shown that the third contact pad $210_1$ and the fourth contact pad $210_2$ are configured to contact the same device 260, it is also possible that each contact pad is configured to contact an individual device.

Conductive material of a conducting structure $232_2$ connecting the second contact pad $212_2$ and the fourth contact pad $210_2$ is removed subsequent to a definition of the conducting structure $232_2$ to thereby define a second conducting path $230_2$ so that a propagation delay difference of signal paths comprising the first conducting path $230_1$ and the second conducting path $230_2$ is at least partially compensated. The conducting structure $232_1$, $232_2$ in FIG. 4 is only schematically and not necessarily has to be a straight line in a rectangular geometry. The conducting structure $232_1$, $232_2$ can have any shape, like a trapezoidal shape, a hexagonal shape, a circular shape and may include bends or turns.

This means, for example, that for each cable, the first cable $220_1$ and the second cable $220_2$, a propagation delay can be measured. The first cable $220_1$ and the second cable $220_2$ can represent a differential cable pair, thus it is desired that the signals propagating through the first cable $220_1$ reach the third contact pad $210_1$ nearly at the same time with a defined, small tolerance as signals propagating through the second cable $220_2$ reach the fourth contact pad $210_2$. For example, if the signal propagating through the second cable $220_2$ is faster than the signal propagating through the first cable $220_1$, the second conducting path $230_2$ can be elongated by removing conductive material (e.g. shown by the shaded parts) of the conducting structure (e.g. adjustment area) $232_2$ in such a way that, for example, like shown in FIG. 4 a zigzag path is shaped. From the first conducting structure $232_1$ conductive material is removed (e.g. shown by the shaded parts), for example, such that the first conducting path forms a straight line between the first contact pad $212_1$ and the third contact pad $210_1$. As shown in FIG. 4, now the first conducting path $230_1$ is a straight line and the second conducting path $230_2$ has a part where it is sharp angled. Thus, the second conducting path $230_2$ is longer than the first conducting path $230_1$ and with this modification the signals propagating through the first cable $220_1$ and propagating through the second cable $220_2$ can reach the third contact pad $210_1$ and the fourth contact pad $210_2$ nearly at the same time. Thus, the removal of conductive material of the conducting structure 232 can result in an at least partial compensation of the propagation delay difference of the signal propagating through a first cable $220_1$ and the signal propagating through a second cable $220_2$.

Thus, the shape of the second conducting path $230_2$ on the printed circuit board 200 is electrically elongated by the removal of conductive material compared to the first conducting path $230_1$ on the printed circuit board 200 in order to at least partially compensate a propagation delay difference between the first cable $220_1$ and the second cable $220_2$.

In an embodiment, the first conducting path $230_1$ is shaped so that the trace width of the first conducting path $230_1$ is constant between the first contact pad $212_1$ and the third contact pad $210_1$ by subsequent removal of conductive material of a conducting structure $232_1$.

Both conducting paths $230_1$ and $230_2$ have, for example, before a removal of conductive material the similar trace geometry $232_1$, $232_2$ (e.g. a similar conductive adjustment area). After the removal of conductive material, for example, the first conducting path $230_1$ is a straight line with a constant width and the second conducting path 232 is a line with constant width but a zigzag geometry.

In an embodiment, the first conducting path $230_1$ and the second conducting path $230_2$ can be arranged in parallel to each other, except for an area (for example, the area of the conducting structure $232_1$, $232_2$) in which the second conducting path $230_2$ comprises an elongation created by the removal of conductive material of a conducting structure. In an embodiment, the first conducting path $230_1$ and the second conducting path $230_2$ can be arranged in parallel to each other, but including an adjustment area in each trace to allow for the propagation delay adjustment. In other words the conducting paths $230_1$, $230_2$ can be arranged in the complete area (e.g. between the respective pads) parallel to each other. They only comprise the conducting structure (adjustment area), which is configured to control the propagation delay difference (between the first signal path and the second signal path).

According to an embodiment, the first line $270_1$ along which the first contact pad $212_1$ and the second contact pad $212_2$ are aligned, can be parallel to a second line $270_2$ along which the third contact pad $210_1$ and the fourth contact pad $210_2$ are aligned. Thus, the distance between the first contact pad $212_1$ and the third contact pad $210_1$ is the same as the distance between the second contact pad $212_2$ and the fourth contact pad $210_2$. Thus a propagation delay of each line (A first line is, for example, the first cable $220_1$, the first contact pad $212_1$, the first conducting path $230_1$ with the first conducting structure $232_1$ and the contact pad $210_1$. A second line is, for example, the second cable $220_2$, the second contact pad $212_2$, the conducting path $230_2$ with the conducting structure $232_2$ and the fourth contact pad $210_2$) can be measured under equal conditions, whereby at the measurement, no conductive material is removed from the conducting structures $232_1$, $232_2$. The shaded parts of the conducting structures $232_1$, $232_2$ are not modified for a first measurement of the propagation delay. When the propagation delay difference between the two lines is known, conductive material of the conducting structures $232_1$, $232_2$ can be removed such that the propagation delay difference is at least partially compensated.

In an embodiment, the printed circuit board 200 comprises a connector connected to the third contact pad $210_1$ and the fourth contact pad $210_2$, wherein the connector is configured to connect to a board. Thus, it is easy to connect the printed circuit board according to the invention with a device 260.

In an embodiment of the printed circuit board 200 one end of the first cable $220_1$ which is not connected to the printed circuit board 200 is attached to a connector, and one end of the second cable $220_2$ which is not connected to the printed circuit board 200 is attached to a connector.

Figure 5:
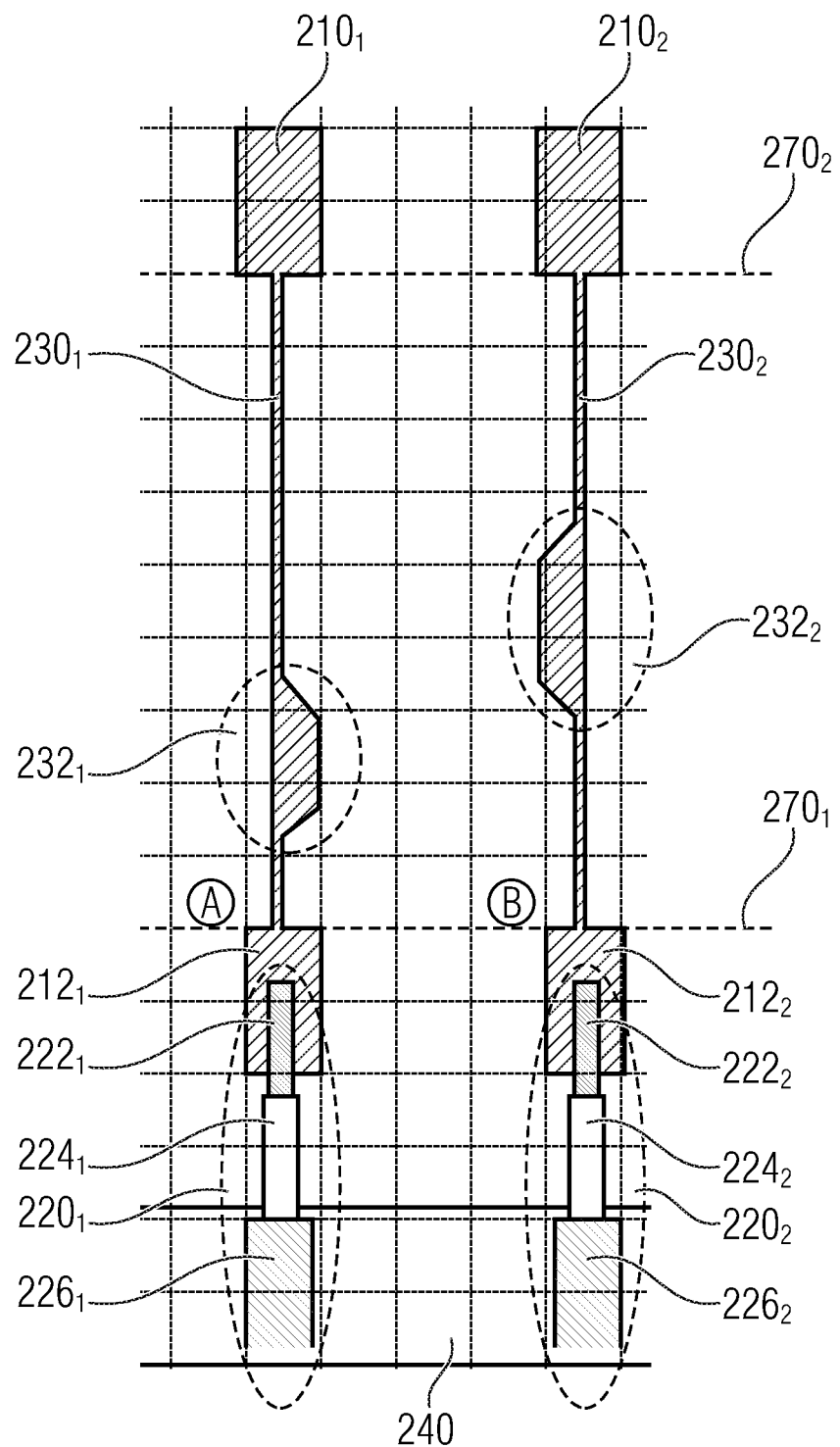
FIG. 5 shows a schematic view of a printed circuit board with a first conducting path and a second conducting path before processing according to an embodiment of the present invention.

FIG. 5 shows a section of a printed circuit board comprising a first contact pad $212_1$, configured to contact a first cable $220_1$, a second contact pad $212_2$, configured to contact a second cable $220_2$, a third contact pad $210_1$, configured to contact a device, a fourth contact pad $210_2$, configured to contact a device, a first conductive structure $232_1$, configured to form a first conducting path $230_1$ connecting the first contact pad $212_1$ and the third contact pad $210_1$, and a second conductive structure $232_2$, configured to form a second conducting path $230_2$ connecting the second contact pad $212_2$ and the fourth contact pad $210_2$. The first conductive structure $232_1$ (i.e. a first adjustment area) and the second conductive structure $232_2$ (i.e. a second adjustment area) are configured to allow for a modification of the propagation delay. This can be an example of a printed circuit board before any modifications.

According to an embodiment the entire first conductive path $230_1$ between pad $210_1$ and $212_1$ can be designed as the first conductive structure $232_1$ (i.e. the adjustment area (A1)), and analogical this is valid for other conductive path's. According to an embodiment of the printed circuit board, the first conducting structure $232_1$ and the second conducting structure $232_2$ can be arranged in parallel to each other. Thus, it is easier to remove conductive material of the conducting structures $232_1$, $232_2$ and space on the printed circuit board can be saved and an electrical performance can be improved.

Optionally, a first design reference line $270_1$ at which the first contact pad $212_1$ and the second contact pad $212_2$ are aligned, can be parallel to a second design reference line $270_2$ at which the third contact pad $210_1$ and the fourth contact pad $210_2$ are aligned.

According to an embodiment, the first conducting structure $232_1$ contains a conductive area and the second conducting structure $232_2$ contains a similar conductive area. The first area and/or second area are intended to allow for a removal of conductive material by laser ablation, milling or etching so that a shape and an electrical length of the first conductive path $230_1$ or the second conductive path $230_2$ may be defined by the removal.

The first conducting structure $232_1$ and/or the second conducting structure $232_2$ can have a trapezoidal or hexagonal shape. In FIG. 5, exemplarily, a trapezoidal shape is illustrated.

In the section (e.g. a cutout section) of the printed circuit board of FIG. 5, also a Ground pad 240 is shown.

The first cable $220_1$ and the second cable $220_2$ can be coaxial cables. Thus, for example, the cable core $222_1$, $222_2$ can be soldered to the contact pads $212_1$, $212_2$ and the cable shielding $226_1$, $226_2$ can be soldered to the ground pad 240. The cable core $222_1$, $222_2$ can be separated from the cable shielding $226_1$, $226_2$ by an inner dielectric insulator $224_1$, $224_2$.

The first conducting path $230_1$ and the second conducting path $230_2$ can, for example, comprise copper material. These copper traces (for example, the first conducting path $230_1$ and/or the second conducting path $230_2$) can be prolonged well-defined to achieve, for example a possible propagation time increase.

The details shown in FIG. 5 can, for example, be a section of the printed circuit board 200 shown in FIG. 2.

If a measurement of the complete signal paths comprising the soldered cables $220_1$, $220_2$ shows that line A is x picoseconds shorter than line B, an elongation can be accomplished by (for example, mechanical) post-processing (for example, milling of the traces, for example of the conducting structures $232_1$, $232_2$).

Figure 6:
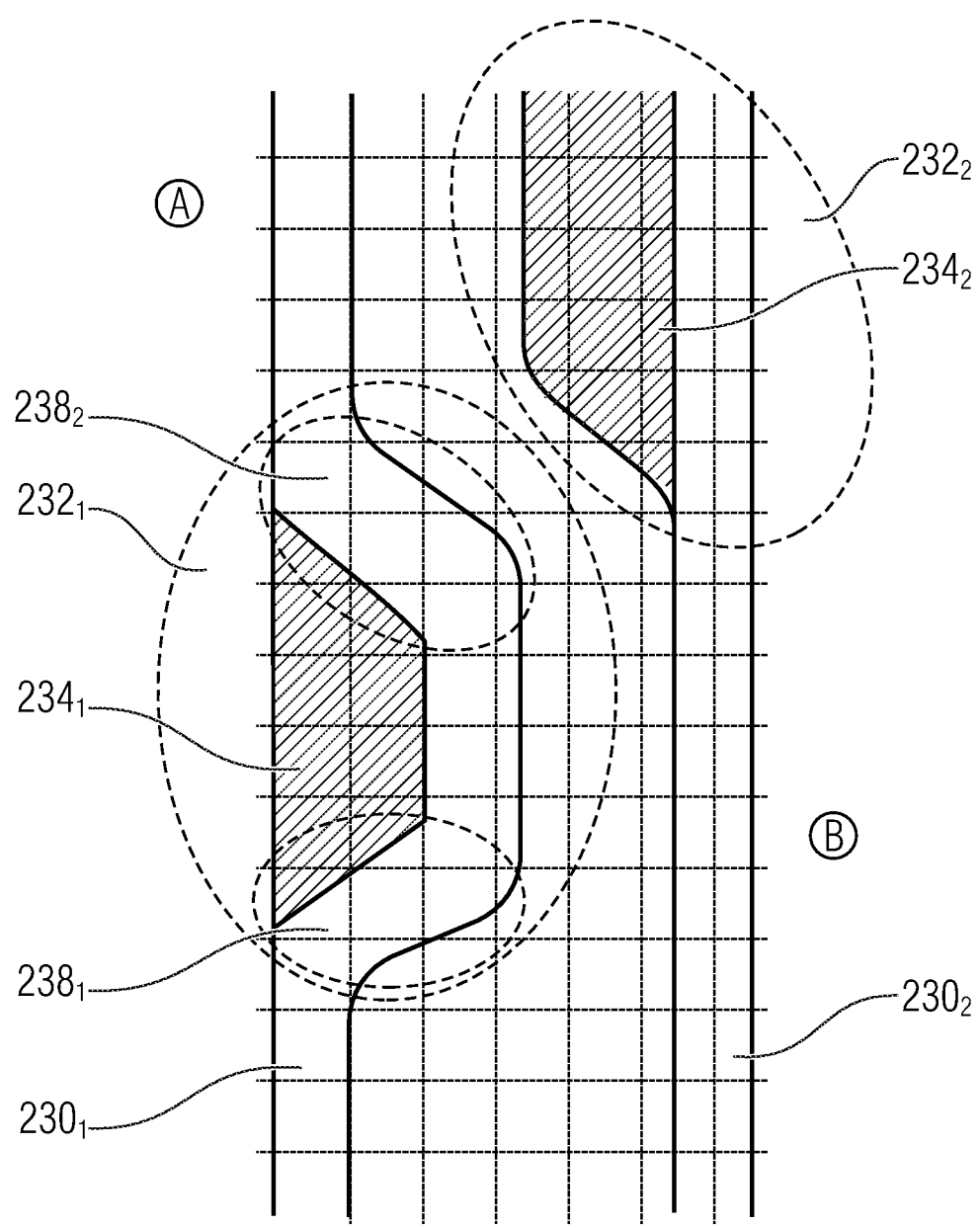
FIG. 6 shows a schematic view of a first conducting path and a second conducting path with an illustration of the processing according to an embodiment of the present invention.

This post-processing can be seen in FIG. 6, which shows a detail of the first conducting path $230_1$ and the second conducting path $230_2$ as, for example, shown in FIG. 5.

As shown in FIG. 6, the black shaded areas $234_1$, $234_2$ can be removed. Graduations are also possible. According to an embodiment, the black shaded area $234_1$ represents a first area of the printed circuit board which is formed by removal of conductive material of a conductive structure $232_1$ by laser ablation, milling, routing or etching, which is located closer to a cable-sided edge of the printed circuit board than a second area, represented by the black shaded area $234_2$ of the printed circuit board which is formed by removal of conductive material of a conductive structure by laser ablation, milling, routing or etching.

By the removal of the shaded area $234_1$ of the conducting structure $232_1$, the first conducting path $230_1$ is elongated. And with the removal of the shaded area $234_2$ of the conducting structure $232_2$, the second conducting path $230_2$ can be realized geometrically shorter (but electrically nearly equal to) than the first conducting path $230_1$. Thus, with this modification, a propagation delay difference between line A and line B of x picoseconds can at least partially be compensated.

The first conducting path $230_1$ and the second conducting path $230_2$ are arranged in parallel to each other, except for trace sections $238_1$, $238_2$ by which the first conducting path $230_1$ receives an elongation created by the removal of conductive material of the first conductive adjustment area $232_1$. Similar trace sections $238_1$, $238_2$ as shown for the first conducting path $230_1$, can be realized for the second conducting path $230_2$. The decision, which path $230_1$ or $230_2$ receives the elongation trace sections $238_1$, $238_2$ depends, for example, on which path $230_1$, $230_2$ has to be elongated to compensate at least partially a propagation delay difference between line A and line B.

Figure 7A:
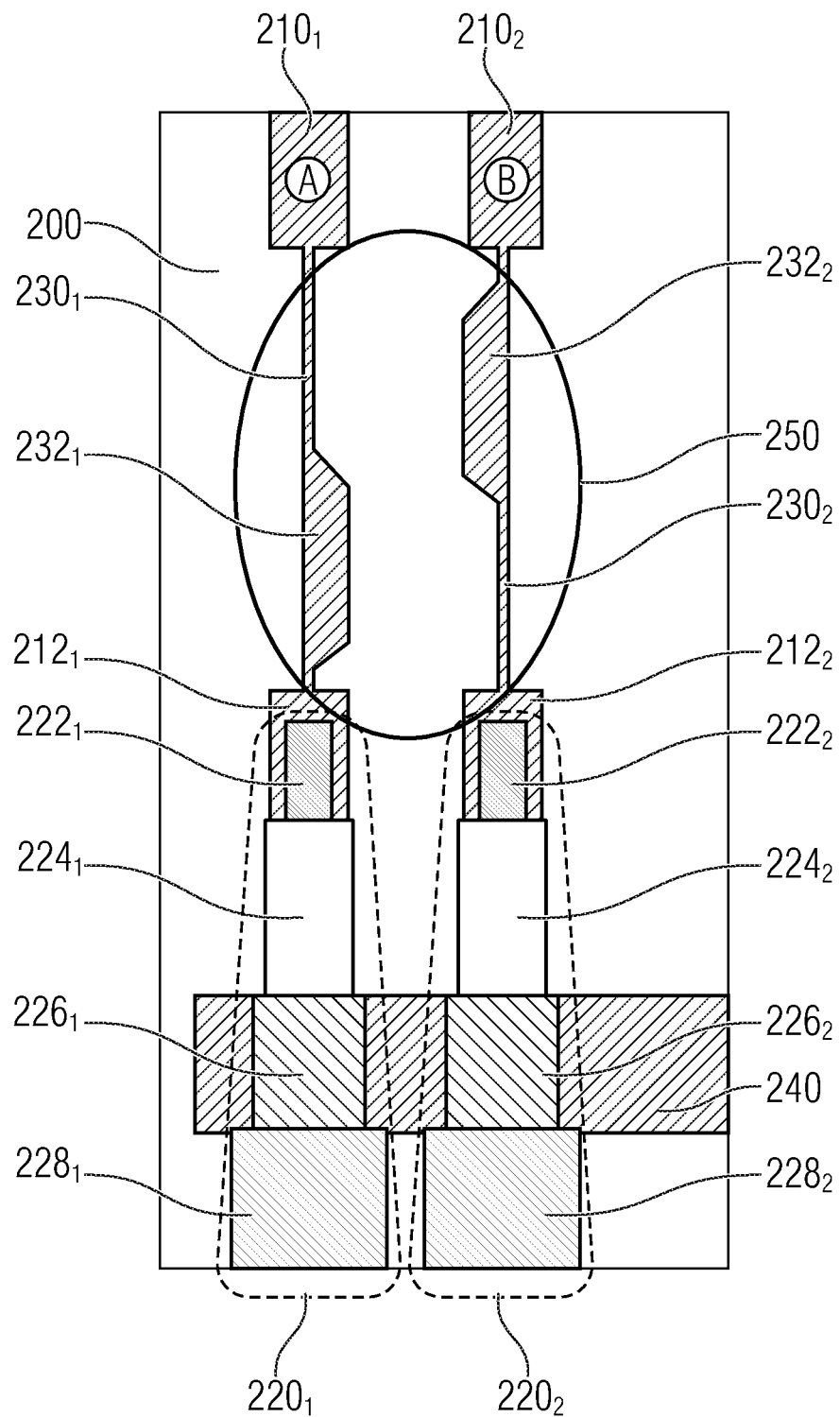
FIG. 7a shows a schematic view of a printed circuit board with a first conducting path and a second conducting path before processing according to an embodiment of the present invention.
Figure 7B:
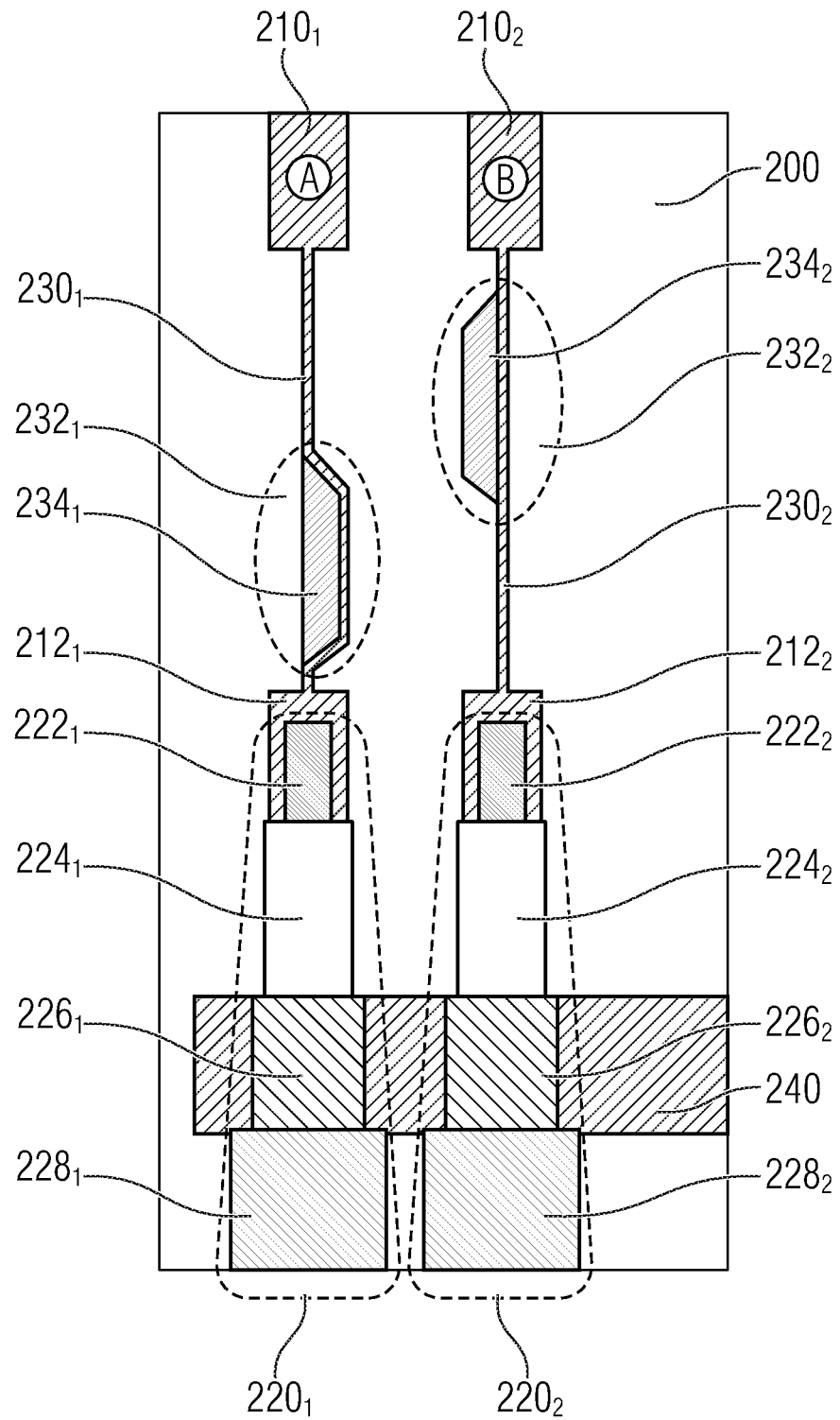
FIG. 7b shows a schematic view of a printed circuit board with a first conducting path and a second conducting path with an illustration of the processing according to an embodiment of the present invention.
Figure 7C:
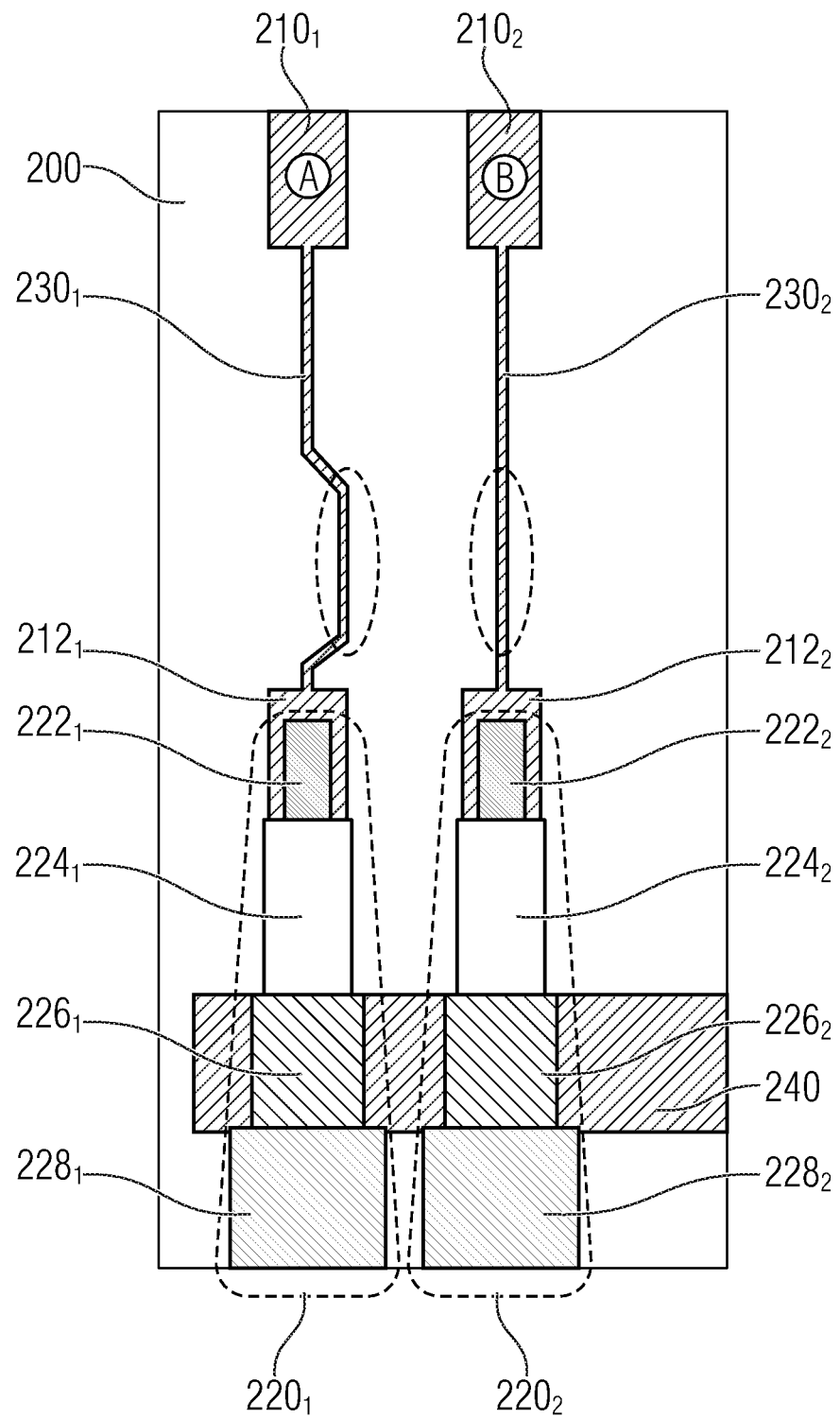
FIG. 7c shows a schematic view of a printed circuit board with a first conducting path a second conducting path after processing according to an embodiment of the present invention.

The FIG. 7a, FIG. 7b and FIG. 7c can, for example, show an illustration of three steps of a method for providing two electrical connections with a very small propagation delay difference between them as a differential pair.

FIG. 7a shows a schematic view of a printed circuit board 200, which can comprise the same attributes with same functionalities as shown in FIG. 5. Within the area 250, the PCB-traces (for example, the first conducting path $230_1$, and the second conducting path $230_2$) have sections with a larger width (for example, in the conducting structure $232_1$ and the second conducting structure $232_2$) in order to reach a signal propagation delay increase, if needed.

With the printed circuit board 200 plus assembled cables as shown in FIG. 7a, a TDR measurement can be executed, to measure propagation delays of line A and line B.

Line A comprises the third contact pad $210_1$, the conducting path $230_1$, the conducting structure $232_1$, the first contact pad $212_1$ and the first cable $220_1$. Line B comprises, for example, the fourth contact pad $210_2$, the second conducting path $230_2$, the conducting structure $232_2$, the second contact pad $212_2$ and the second cable $220_2$.

If the TDR measurement shows that line A is electrically shorter than line B, line A can, for example, made longer. This can be done by removing the marked area $234_1$ in the signal path A. Physically this may be reached by milling, laser ablation or a defined etching process. The increased line width $234_2$ (i.e. an enlargement) of line B may also be removed. According to an embodiment, the marked area $234_1$ represents a first area of the printed circuit board which is formed by removal of conductive material of a conductive structure $232_1$ by laser ablation, milling, routing or etching, which is located closer to a cable-sided edge of the printed circuit board than a second area, represented by the increased line width $234_2$ of the printed circuit board which is formed by removal of conductive material of a conductive structure by laser ablation, milling, routing or etching.

FIG. 7b can show the same attributes and functionalities as shown in FIG. 7a.

FIG. 7c can also show a printed circuit board 200 with the same attributes and functionalities as the printed circuit board 200 shown in FIG. 7b or FIG. 7a.

FIG. 7c shows the printed circuit board 200, for example, after the modification. As a result, the lines may be matched with a very low propagation delay difference.

As shown in FIG. 7c, the first conducting path $230_1$, comprises a trapezoidal portion so that the first conducting path 230₁ is electrically elongated compared to the corresponding second, straight conducting path 230₂.

The herein described invention has the advantages that the cables 220₁, 220₂ do not need to be measured and sorted before the assembly step (avoids mix-ups). Also, the measurement of the lines can be made in the cable assembly state of production and the post processing (milling step) may be automated.

Figure 8:
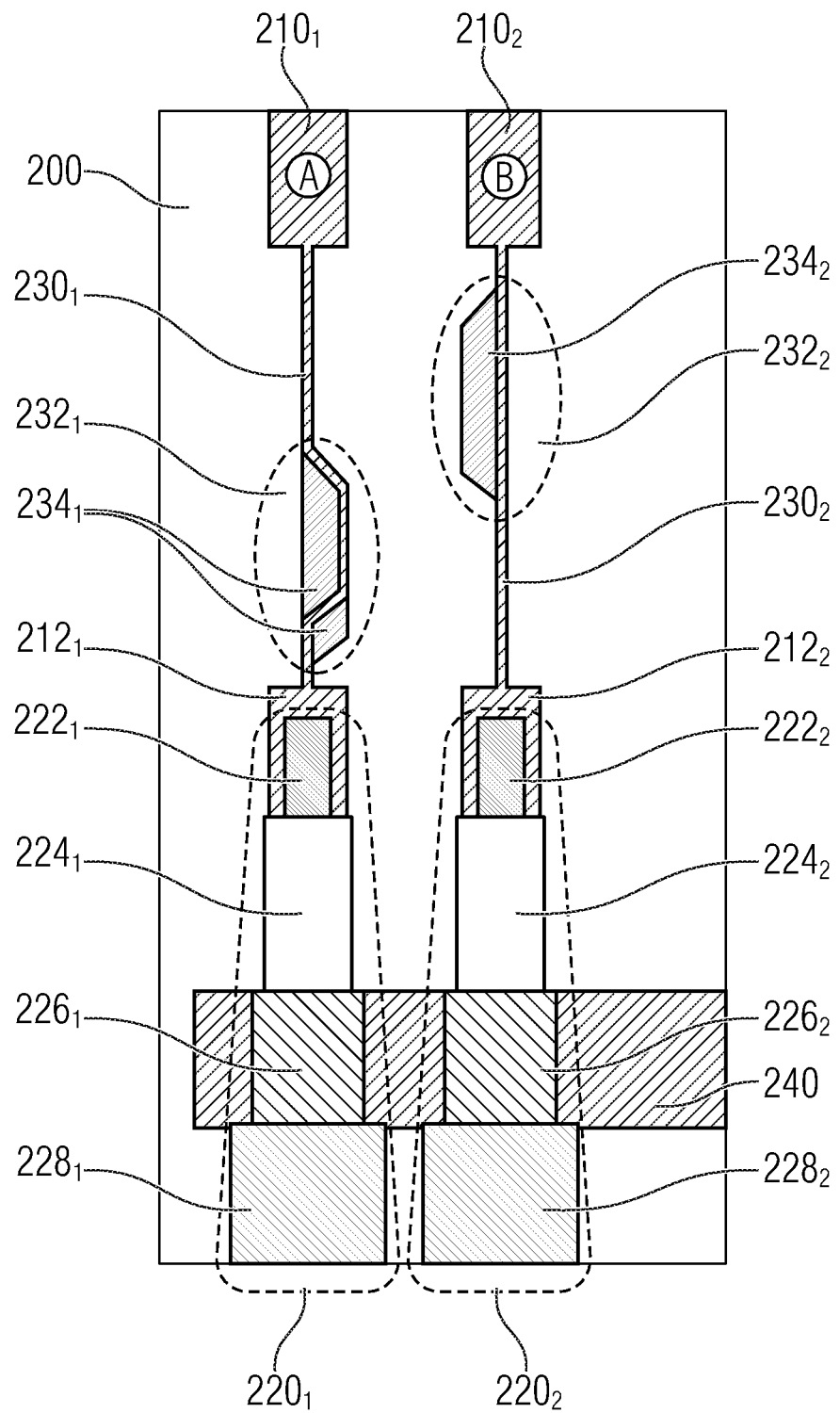
FIG. 8 shows a printed circuit board with a different layout for the first conducting path according to an embodiment of the present invention.

FIG. 8 shows a printed circuit board according to an embodiment of the invention, which can comprise the same features and functionalities as the printed circuit board 200 shown in FIG. 7*a*, FIG. 7*b* and FIG. 7*c*. As shown in FIG. 8, the area 234₁ of the conducting structure 232₁ can have smaller increments. Thus, only a small space is needed by the first conducting path 230₁.

The FIGS. 9*a*, 9*b*, 9*c*, 9*d* and 9*e* show a conducting path 230 with a conducting structure 232 according to an embodiment of the invention. The conductive structure 232 can be configured to allow for a modification of the propagation delay by definition of shapes of the conducting path 230. Conductive material as marked by the shaded area 234 can be removed of the conducting structure 232, in order to modify the electrical length of the conducting structure 232, to obtain a conducting path 230.

The conducting path 230 can thus comprise an area 232, where it is, for example, sharp angled (see FIG. 9*a*), trapezoidal (see FIG. 9*b*), hexagonal (see FIG. 9*c*), rippled (see FIG. 9*d*) or circular (see FIG. 9*e*). This list of shapes of the conducting path 230 is to be regarded as exemplarily and not as exhaustive.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A electronic device comprising
a first contact pad for receiving a first signal from a first cable;
a second contact pad for receiving a second signal from a second cable;
a third contact pad contacting a device;
a fourth contact pad contacting the device;
a first conducting path connecting the first contact pad and the third contact pad, wherein the first conducting path comprises a first non-removable conductor and a first removable conductor; and
a second conducting path connecting the second contact pad and the fourth contact pad, wherein the second conducting path comprises a second non-removable conductor and a second removable conductor, wherein the first and the second removable conductors are configured to compensate for a propagation delay difference between the first and the second signals through the first and the second conducting paths by removal of the first and the second removable conductors respectively;
wherein a shape of the first removable conductor and a shape of the second removable conductor are trapezoidal, wherein a shape of the first non-removable conductor is continuous and comprises uniform thickness, wherein the first non-removable conductor comprises an indentation, and wherein the first non-removable conductor fits within a recess created by the indentation in the first non-removable conductor.

2. The electronic device according to claim 1, wherein the second non-removable conductor comprises a linear continuous shape of uniform thickness, and wherein the second non-removable conductor extends out from the non-removable portion.

3. The electronic device according to claim 1, wherein first removable conductor on the first conducting path is offset from the second removable conductor on the second conducting path.

4. The electronic device according to claim 1, further comprising a connector connected to the third contact pad and the fourth contact pad, wherein the connector is configured to connect to a board.

5. The electronic device according to claim 1, wherein a free end of the first cable is attached to a connector, and wherein a free end of the second cable is attached to the connector.

6. The electronic device according to claim 2, further comprising a first area and a second area, wherein the first area in the first conducting path is operable to be formed by removal of the first removable conductor by one or more of a laser ablation, milling, routing or etching and is located closer to a cable-sided edge of the electronic device than the second conducting path from the second area operable to be formed by removal of the second removable conductor by one or more of a laser ablation, milling, routing or etching.

7. A printed circuit board comprising:
a first contact pad contacting a first cable;
a second contact pad contacting a second cable;
a third contact pad contacting a device;
a fourth contact pad contacting the device;
a first conducting structure forming a first conducting path connecting the first contact pad and the third contact pad, wherein the first conducting structure comprises a first non-removable conductor and a first removable conductor; and
a second conducting structure forming a second conducting path connecting the second contact pad and the fourth contact pad,
wherein the first conducting structure and the second conducting structure are configured to avow modification of a propagation delay by definition of shapes of the first conducting path and second conducting path;
wherein the second conducting structure comprises a second non-removable conductor and a second removable conductor, wherein a shape of the first removable conductor and a shape of the second removable conductor are trapezoidal, wherein a shape of the first non-removable conductor is continuous and comprises uniform thickness, wherein the first non-removable conductor comprises an indentation, and wherein the first non-removable conductor fits within a recess created by the indentation in the first non-removable conductor.

8. The printed circuit board according to claim 7, wherein a first design reference line along which the first contact pad and the second contact pad are aligned is parallel to a second design reference line along which the third contact pad and the fourth contact pad are aligned.

9. The printed circuit board according to claim 7, wherein the first removable conductor and the second removable conductor are configured to allow for a removal of conductive materials of the first removable conductor and the second removable conductor respectively by one or more of a laser ablation, milling or etching wherein the shape and an electrical length of the first conducting path and the shape and an electrical length of the second conducting path are defined by the removal of the conductive materials.

10. The printed circuit board according to claim 7, wherein the first cable and the second cable are coaxial cables.

11. The printed circuit board according to claim 7, wherein the propagation delay is determined by time domain reflectometry measurements (TDR).

12. The printed circuit board according to claim 7, wherein a conductive material of the second removable conductor is operable to be removed subsequent to a definition of the second conducting structure to define the second conducting path so that a propagation delay difference of signal paths comprising the first conducting path with the first cable and the second conducting path with the second cable is at least partially compensated.

\* \* \* \* \*